United States Patent [19]

Kobayashi et al.

[11] 4,121,007

[45] Oct. 17, 1978

[54] PRINTED CIRCUIT BOARD MADE BY DISPERSION IMAGING

[75] Inventors: Hidehiko Kobayashi; Tatsumi Arakawa; Tetsuo Shiga; Kaoru Ohmura; Sakae Ito, all of Fuji, Japan

[73] Assignee: Asahi Kasei Kogyo Kabushiki Kaisha, Osaka, Japan

[21] Appl. No.: 713,317

[22] Filed: Aug. 10, 1976

[30] Foreign Application Priority Data

Aug. 19, 1975 [JP]   Japan ................................ 50-99785
Jun. 21, 1976 [JP]   Japan ................................ 51-72250

[51] Int. Cl.² ............................................. H01K 3/18
[52] U.S. Cl. .................................... 428/201; 428/199;
    428/220; 428/216; 427/96; 427/98; 427/43;
    427/53; 427/56; 96/38.4; 174/68.5
[58] Field of Search .................... 427/98, 43, 53, 56,
    427/54; 96/48 QP, 362, 44, 38.4; 428/201, 199,
    220, 216

[56] References Cited

U.S. PATENT DOCUMENTS 4,000,334   12/1976   Hallman et al. ................. 427/43 X

*Primary Examiner*—Ralph S. Kendall
*Attorney, Agent, or Firm*—Burgess, Dinklage & Sprung

[57] ABSTRACT

A novel printed circuit board with a circuit of high precision having a polymer coat layer between a base and a dispersion imaging material layer and a pattern circuit on undispersed portions of the dispersion imaging material layer. Such a printed circuit board is prepared by a simplified process which comprises essentially two steps, namely, exposure of the dispersion imaging material through a circuit pattern mask to obtain a pattern circuit of the unexposed portions and conductive metal plating wherein said unexposed portions are selectively deposited with the conductive metal due to the specific effect of provision of the polymer coat layer directly under the dispersion imaging material layer.

13 Claims, No Drawings

PRINTED CIRCUIT BOARD MADE BY DISPERSION IMAGING

This invention relates to a novel printed circuit board and a method for preparing the same.

Heretofore, there has been widely known a printed circuit board which is prepared from a copper-clad laminate by employing many steps such as coating of the laminate with a photo-resist, exposure, development, etching, etc. On the other hand, there has been proposed another simplified method for preparing a printed circuit board using a copper-clad laminate, which comprises the steps of screen printing and etching. The latter method, however, has a defect that the circuit board produced cannot have sufficient precision. Then, there has been really awaited in the field a printed circuit board which can meet high precision requirement and can be manufactured through a simplified process and there have been made many researches to realize such a printed circuit board.

Japanese Patent Application Laid-Open Specification No. 48-19303 discloses a novel imaging method which is capable of effecting exposure in a light room and needs no procedures such as development of the exposed material or fixing thereof, and more particularly, it discloses a method in which a dispersion imaging material is exposed through a mask to cause dispersion of the material in the exposed areas so that a stable and permanent image can be obtained. The Specification further describes the method is applicable to the manufacture of a printed circuit board but has no illustrative suggestion concerning how to apply it to a printed circuit board. In fact, it is very difficult to produce a printed circuit board by such a method as disclosed in the Specification, to wit, a method wherein a dispersion image is formed through exposure on a dispersion imaging material disposed directly on a base without providing a polymer layer therebetween. If the material having a dispersion image is subjected to a conductive metal plating operation, the conductive metal is deposited on both exposed and unexposed portions without selectivity.

As a result by an extensive and intensive study of the inventors of the present invention, they found a very simple method for preparing a printed circuit board of high precision. This novel method consists essentially of only two steps, namely exposure and plating with a conductive metal and can omit many of the steps which are inevitably needed in the conventional method, such as photo-resist coating, exposure, development, etching and removal of the photo-resist, etc.

One object of the present invention is to provide a novel printed circuit board of a high precision circuit.

Another object of the present invention is to provide a method for preparing a printed circuit board as mentioned above, which is simple and easy to conduct.

The foregoing and other objects, features and advantages of the present invention will be apparent to those skilled in the art from the following detailed description and appended claims.

In one aspect of the present invention, there is provided a printed circuit board comprising a base made of an insulating material; a layer coated on the base and made of a polymer having a melting point or a softening point of 50° to 300° C.; a layer covered on the layer of polymer and made of a dispersion imaging material; said layer of dispersion imaging material having dispersed portions and undispersed portions; and a pattern circuit of a conductive metal deposited on the undispersed portion.

In another aspect of the present invention, there is provided a method for preparing a printed circuit board comprising applying a polymer having a softening point or a melting point of 50° to 300° C. onto a base at least on one side thereof to form a polymer layer on said base; applying onto said polymer layer a dispersion imaging material which is dispersible in response to energy absorbed by the material in an amount exceeding the threshold value of the dispersion imaging material to form a dispersion imaging material layer covered on said polymer layer; applying energy to the dispersion imaging material through a circuit pattern mask till the absorbed energy exceeds the threshold value of the material to cause dispersion of the material at its exposed portions, thereby forming an imaged board; and subjecting the imaged board to an electrically conductive metal plating to deposit the electrically conductive metal on the dispesion imaging material at its unexposed portions, forming a pattern circuit.

The essential characteristic feature of the present invention lies in the provision of a polymer layer formed under the dispersion imaging material layer made of a specific metal or alloy. Such a formation of the polymer layer is indispensable to selective deposition of a metal at unexposed or undispersed portions of the dispersion imaging material in metal plating, electro plating and/or electroless plating, while preventing metal deposition at exposed or dispersed portions thereof and, in addition, serves very much to improve anchorage characteristics of the plated metal to the base due to good adhesion characteristics between each two continuous layers of the present invention.

The term "dispersion" herein used is intended to mean a phenomenon that a continuous thin film of solid state becomes discontinuous when energy absorbed in material exceeds the critical threshold value of the material upon absorption of the energy.

The term "softening point" herein used is intended to mean a temperature at which a polymer flows. A polymer having no melting point such as an amorphous polymer is known to have a softening point near a glass transition point. In a polymer having a melting point, its softening point generally coincides with the melting point thereof, and in such a polymer the softening point is not usually indicated and it is not indicated also in the present specification.

It has not yet been made clear how the polymer coat underlying the dispersion imaging material serves to selectively prevent the exposed portions from being plated, but it has been found that the polymer to be employed in the present invention is necessarily of a melting point or a softening point in the range of 50° to 300° C. and that a polymer having a melting or a softening point lower than 50° C. has a defect of poor storage stability and a polymer having a melting or a softening point higher than 300° C. does not provide the desired effect of the present invention that plating is accomplished only at unexposed portions.

So long as the melting or softening point of the polymer layer is within the range of 50° to 300° C., the dispersion imaging material layer covered on the polymer layer is prevented, at its exposed portions, from being plated and, as a result, in a plating operation, the material is caused, only at its unexposed and undispersed portions, to retain its property as in the original state, that is, it has an electrical conductivity to deposit thereon a metal from an electro plating solution and acts also as a plating seed to deposit thereon a metal from an electroless plating solution.

According to the present invention, it is critical that the polymer layer employed in the present invention has a softening or a melting point in the range of 50° to 300° C. Further, the polymer layer is naturally preferable to have a decomposition point higher than the softening point or melting point and to be difficult to be thermally decomposed. In case of the softening or melting point of the polymer layer is lower than 50° C. there is caused a problem of storage stability and in case it is higher than 300° C. the effect of the present invention that unexposed portions alone are selectively plated cannot be expected as mentioned above. It is further preferable that the polymer layer has good adhesion characteristics to the base such as a laminate etc. The polymer layer may further advantageously have a melting point or a softening point lower than the melting point of the dispersion imaging material layer. Either a thermoplastic resin or a thermohardening resin may be employed. In case thermohardening resins are employed, it is preferable to provide the dispersion imaging material on the polymer layer unhardened, obtain a pattern by dispersion by application of the imaging energy and then make the polymer hardened by heating. As specific examples of the polymer employable in the present invention, there can be mentioned polyurethane, polyvinylidene chloride, polyvinyl acetate, polyvinyl butyral, a copolymer of vinylidene chloride and vinyl acetate or acrylonitrile, a copolymer of vinyl chloride and vinyl acetate, a polycarbonate, a polyamide, a copolymer of styrene and acrylonitrile, a copolymer of acrylonitrile, butadiene and styrene, an epoxy resin and a blend thereof. The thermohardening resins are employed after being suitably blended with an initiator for hardening reaction or a crosslinking agent. The epoxy resin may be preferably employed in the form of a blend of an epoxy resin and a polyurethane or polyvinyl butyral. In this case, the adhesion characteristics between the base and the polymer undercoat layer and between the polymer undercoat layer and the deposited metal are by far improved. The thickness of the polymer layer is not so critical but advantageously within the range of 0.5 to 100μ and more advantageously from 1 to 50μ.

The dispersion imaging material to be employed in the present invention has a threshold value for a dispersion energy and upon absorption of the energy, it changes, at its portions exposed to the energy, from a continuous state to a discontinuous state wherein the film of the dispersion imaging material becomes a crowd of spaced apart separate microspherical or other shapes of particles due to contraction by the action of surface tension in melting of the material upon dispersion.

The dispersion imaging materials useful in the practice of the invention are characterized in that they have a melting point which is low enough to permit temporary melting of the material under the effect of an available source of imaging energy. The energy required to temporarily melt and disperse the dispersion imaging material must be smaller than the energy endurable by either the polymer layer coated under the material or the base. As specific examples of the dispersion imaging materials, there can be mentioned iron, cobalt, nickel, copper, silver, gold, bismuth, antimony, tin, aluminum, cadmium, zinc, lead, selenium, indium, tellurium, alloys of these atoms and compositions including these atoms. These materials all have a small solubility in a plating bath, but the iron family metals such as iron, cobalt and nickel are preferable and especially nickel is the most suitable in view of its good adhesion characteristics to the dispersion imaging material.

The thickness of the dispersion imaging material layer is advantageously within the range of 50 to 2,500 Å and more advantageously 100 to 1,000 Å. In general, in respect of the thickness of the dispersion imaging material, it will be sufficient so long as the dispersion imaging material has an electrical conductivity in electro-plating or acts as a plating seed in electroless plating, and the thickness of the material is not essentially critical. However, in order to have a low threshold value for dispersion and to easily cause the continuous film of the material where exposed to change toward the formation of spaced apart separate microspherical or other shapes of particles in dispersion, the above range may be advantageously employed. In case it is thinner than 50 Å, the optical density of the dispersion imaging material layer decreases preventing sufficient energy absorption so that the threshold value for the dispersion energy is inevitably increased, while in case it is thicker than 2,500 Å, energy is sufficiently absorbed but the threshold value of the material layer is again increased due to its large heat capacity so that it becomes difficult to cause dispersion and even if dispersed the particles formed upon dispersion become coarse and the resolution is deteriorated, lowering the precision.

The material of the base employable for the present invention may be selected from a wide class of materials so long as they have insulating properties. Stated illustratively, both an inorganic matter such as a silicate glass, ceramics, mica, etc. and an organic matter such as cellulose acetate, polystyrene, polyethylene, polypropylene, etc. may be employed. Further, a laminate of phenolic resin, polyester resin or epoxy resin with paper or glass cloth substrate incorporated therein, or a film of polyester or polyimide may be suitably employed. These have an excellent heat resistance property. Especially, the epoxy resin laminate is desirable further in dimensional stability and chemical resistance and the polyimide film is desirably employed as a flexible base of excellent heat resistance.

In practicing the method of the present invention, the polymer layer may be formed in such a manner as ordinarily employed for application of coating materials, e.g. brushing, dipping or spraying. The dispersion imaging material layer is formed on the base which is coated with the polymer layer by vacuum deposition, sputtering, ion plating, etc. by using an appropriate apparatus. In this connection, it is noted that when through-holes are preliminarily formed in the base and the dispersion imaging material is applied also to the inner walls of the through-holes by, e.g. ion plating having good throwing power before the steps of exposure and conductive metal-deposition, there can be produced a printed circuit board with necessary through-holes at the same time.

The exposing energy to be employed in the present invention is necessarily larger than the amount of energy corresponding to the threshold value of the dispersion imaging material employed which value is varied depending upon its kind and thickness and also influenced by the kind of the employed polymer undercoat. In the present invention, the energy is applied in such an amount that the dispersion imaging material is sufficiently dispersed upon exposure to the energy to render the dispersed portions visually distinguishable from the undispersed portions. The energy is advantageously radiant energy or particle energy which is capable of simultaneously irradiating plural separate portions of the dispersion imaging material layer. The energy may be of a holding type or a pulse type. As specific examples of the sources of energy, there can be mentioned a flashlamp, infrared lamp, laser beam, electron beam, etc. The irradiation is desired to be as short as possible in view of the resolution of the image obtained and the possible decomposition of the underlying polymer layer so that a pulse of less than several milliseconds is preferable. The shorter the irradiation time, the more is improved the resolution of the image obtained and the more is reduced or minimized the decomposition of the polymer layer. To meet this requirement, a xenon flashlamp or a pulse laser is optimum.

The irradiation is carried out on the dispersion imaging material through a circuit pattern mask to form an imaged board in an ordinary method as shown for example in Japanese Patent Application Laid-Open Specification No. 48-19303 to obtain a circuit pattern of unexposed or undispersed portions.

For plating in the present invention, ordinary electroplating or electroless plating is employable. They are used alone or in combination. As examples of electrical conductive metals, there can be mentioned copper, silver, nickel, etc. and copper or nickel is ordinarily employed in view of its good electrical conductivity. It is recommended to further apply plating of gold, tin, solder or the like onto the surface of the obtained pattern circuit for inhibition of surface contamination or oxidation, improvement of solderability or the like. The melting plating or gold, tin or solder can be effected in a very short period, namely, in a few seconds and therefore, the pattern circuit obtained according to the method of the present invention is subject to no influence or damage in this further plating process.

The present invention will now be illustrated in detail by reference to the following Examples that by no means limit the scope of the present invention.

The polymer layer and the dispersion imaging material layer of the present invention may be provided at least on one side of the base. In case a circuit pattern is required to be formed only on one side of the board, the layers are provided only on that side and in case a circuit pattern is required for both sides of the board, the layers are provided on either side of the base.

EXAMPLE 1

NATIONAL LITE R-1610 (Trade Name of an epoxy resin laminate with a substrate of glass cloth incorporated therein which is manufactured and sold by MATSUSHITA ELECTRICWORKS LTD. Japan) having a thickness of 2 mm. was subjected to a surface treatment with an aqueous dichromic acid-sulfuric acid mixture (containing sulfuric acid in an amount of more than saturation) for 5 minutes. HAMAKOLLAN VK-1080 (Trade Name of polyurethane produced by Yokohama Rubber Co., Ltd., Japan and having a softening point of 91° to 103° C.) was coated on the laminate using as a solvent N,N-dimethylformamide and then dried to form a polymer layer of $10\mu$ in thickness. Copper was sputtered on the coat in a thickness of 300 Å. The thus obtained material was subjected through a circuit pattern mask to flashlight of 1 millisecond pulse width and a quantity of 0.8 joule/cm$^2$ emitted from a xenon flashlamp to obtain a circuit pattern. The exposed portion had an extremely high electrical resistance and was substantially insulated. Then, the material was subjected to copper plating at a temperature of 50° C. for 30 minutes using TCP-701 (Trade Name of electroless plating solution produced and sold by Shipley, U.S.A.) which is mainly composed of copper sulfate, formalin, lithium hydroxide and a complexing agent. Copper was deposited on the unexposed portions in a thickness of $5\mu$, thereby to form a pattern circuit of copper having a sharp electrical contrast. The obtained copper pattern circuit conformed, in high precision, to the used circuit pattern mask and satisfied the characteristic requirements for a circuit board. The adhesive properties of the copper pattern circuit were excellent and passed a Scotch tape test based on the standard of ANSI pH 1.28. In a thermal shock test, no change such as a blister or peeling was observed in three cycles. The thermal shock test was conducted in such a way that the sample was held in either one of temperature controlled baths of $-30°$ C. and 70° C. for 1 hour, and moved into another bath within 30 seconds to be held there for another 1 hour, repeating these operations three times to observe a change of the sample.

EXAMPLE 2

NATIONAL LITE R-1110 (Trade Name of an epoxy resin laminate with a substrate of paper incorporated therein which is manufactured and sold by MATSUSHITA ELECTRICWORKS, Japan) having a thickness of 2 mm. was treated with 1,000 ml. of solution composed of 600 ml. of sulfuric acid, 150 ml. of phosphoric acid, 28 g. of chromic anhydride and the balance of distilled water for 2 minutes. The thus obtained base was coated in a thickness of $5\mu$ with 100 parts by weight of AER-664 (Trade Name of an epoxy resin produced by Asahi Kasei Kogyo K.K., Japan and having a melting point of 95° to 105° C.), 4 parts by weight of dicyandiamide and 0.4 part by weight of benzyldimethylamine, using a solvent of 1,900 parts by weight of methyl ethyl ketone (5% solution), and then heated at a temperature of 150° C. for 30 minutes. The obtained polymer coat layer had a softening point of 110° C. Nickel was vacuum-deposited on the coat in a thickness of 150 Å. The thus obtained board material was then subjected through a circuit pattern mask having a number of thin lines (10 lines per 1 mm.) to flashlight of 50 microseconds pulse width and a quantity of 1.0 joule/cm$^2$ emitted from a xenon flashlamp to obtain a circuit pattern, and subsequently subjected to electroless plating at a temperature of 90° C. for 30 minutes in a nickel plating bath prepared by adding 45 g. of nickel chloride, 100 g. of sodium citrate, 11 g. of sodium hypophosphite and 50 g. of ammonium chloride to 1,000 cc. of distilled water. As a result, nickel plating of $6\mu$ in thickness was accomplished on the unexposed portions to form a nickel pattern circuit having a high electrical contrast. The obtained pattern circuit had definite thin lines (10 lines per 1 mm.), precisely conforming to the circuit pattern mask used and satisfied other characteristics required for a circuit board. The adhesive properties of the nickel pattern circuit were excellent and easily passed a Scotch tape test based on the standard of ANSI pH 1.28.

EXAMPLE 3

100 parts by weight of AER-661 (Trade Name of epoxy resin produced and sold by Asahi Kasei Kogyo K.K., Japan and having a melting point of 70 to 80° C.), 4 parts by weight of dicyandiamide and 0.3 part by weight of benzyldimethylamine were dissolved in ethyl cellosolve to form a 5% solution. On the other hand, S-LEC BM-2 (Trade Name of polyvinyl butyral produced by Sekisui Chemical Co., Ltd., Japan and having a softening point of about 140° C.) was dissolved in methyl ethyl ketone to form a 5% solution. These two solutions were mixed with each other in equal amounts. The mixed solution was then coated on DIAFOIL (Trade Name of polyethylene terephthalate film of 100μ in a thickness produced by Mitsubishi Plastics Industries, Japan) and dried at a temperature of 150° C. for 30 minutes. The thickness of the coat after drying was 5μ and the softening point thereof was 110° to 140° C. Nickel was vacuum-deposited on the coat in a thickness of 200 Å. The thus obtained board material was subjected through a circuit pattern mask to flash of 100 microseconds pulse by scanning irradiation with Nd:YAG laser device SL 129T (manufactured and sold by NEC, Japan) at 50 millijoules output to form a pattern circuit. The thus obtained board material was then subjected to copper plating at a temperature of 50° C. for one hour by using TMP-100 (Trade Name of electroless plating solution produced and sold by Okuno Kagaku K.K., Japan) which is composed mainly of copper sulfate, formalin, lithium hydroxide and a complexing agent. Copper plating of 5μ in thickness was formed on the unexposed portions and a copper pattern circuit of high electrical contrast was obtained. The adhesive properties of the thus plated copper were excellent and passed a Scotch tape test based on the standard of ANSI pH 1.28. In a thermal shock test similar to that of Example 1, there was found no change in five cycles.

EXAMPLE 4

A mixed solution of epoxy resin and polyvinyl butyral prepared in the same manner as in Example 3 was coated on an epoxy resin laminate (2 mm. in thickness) as used in Example 2 which had been surface-treated in the same manner as in Example 2 and dried at a temperature of 150° C. for 30 minutes. The thickness of the coated polymer film after drying was 5μ. Iron was vacuum-deposited on the coat in thickness of 150 Å. The material was subjected through a circuit pattern mask to flashlight of 50 microseconds pulse width and a quantity of 0.9 joule/cm$^2$ emitted from a xenon flashlamp to form a circuit pattern. The electrical resistance of the exposed portions was so high as to be substantially insulated. The material was then subjected to electroless copper plating at a temperature of 50° C. for 1 hour by using CP-70 (Trade Name of an electroless copper plating solution produced and sold by Shipley, U.S.A.). Copper plating of 10μ in thickness was formed on the unexposed portions to obtain a copper pattern circuit of high electrical contrast. Then, the print circuit board was subjected to a Scotch tape test and a thermal shock test in a similar manner to that of Example 1. The board easily passed the Scotch tape test and caused no trouble such as blistering or peeling in five cycles of the thermal shock test.

EXAMPLE 5

NATIONAL LITE R-1110 (Trade Name of an eposy resin laminate with a paper substrate incorporated therein which is manufactured and sold by MATSUSHITA ELECTRICWORKS, Japan) having a thickness of 2 mm. was coated in a thickness of 5μ with 100 parts by weight of AER-664 (Trade Name of epoxy resin produced by Asahi Kasei Kogyo K.K., Japan), 4 parts by weight of dicyandiamide and 0.4 part by weight of benzyldimethylamine using a solvent of 1,900 parts by weight of methyl ethyl ketone (5% solution). The obtained polymer layer had a softening point of 110° C. Bismuth was vacuum-deposited on the polymer coat layer in a thickness of 800 Å. The board material was subjected through a circuit pattern mask to flashlight of 100 milliseconds pulse width and a quantity of 1.0 joule/cm$^2$ emitted from a xenon flashlamp to obtain a circuit pattern and then heated at a temperature of 150° C. for 30 minutes, Subsequently, the board material was subjected to copper-plating at a current density of 4A/dm$^2$ at a temperature of 25° C. by using an electroplating solution containg 200 g/liter of copper sulfate and 45 g/liter of sulfuric acid. Copper was selectively deposited on the unexposed portions to form a copper pattern circuit of high electrical contrast. The adhesive properties of the pattern circuit of copper were excellent.

EXAMPLE 6

NATIONAL LITE R-2110 (Trade Name of a phenolic resin laminate with a pater substrate incorporated therein which is manufactured and sold by MATSUSHITA ELECTRICWORKS LTD., Japan) having a thickness of 2 mm. was coated in a thickness of 10μ with AER-669 (Trade Name of epoxy resin produced by Asahi Kasei Kogyo K.K., Japan and having a melting point of 135° to 155° C. and a softening point of 92° to 107° C.) by using a solvent of methyl ethyl ketone. A composition of 81 atomic parts of tellurium, 15 atomic parts of germanium, 2 atomic parts of sulfur and 2 atomic parts of indium was sputtered in a thickness of 300 Å on the polymer coat layer. The obtained board material was subjected through a continuous circuit pattern mask to flashlight of 1 millisecond pulse width and a quantity of 0.8 joule/cm$^2$ emitted from a xenon flashlamp to form a circuit pattern. The board material was then subjected to a copper plating by using TMP-100 (Trade Name of an electroless plating solution produced and sold by Okuno Kagaku K.K., Japan) and further subjected to a copper plating by using an electro-plating solution containing 200 g/liter of copper sulfate and 45 g/liter of sulfuric acid at a current density of 4 A/dm$^2$ and at temperature of 25° C. Copper was selectively deposited on the unexposed portions to form a copper pattern circuit of high electrical contrast. The adhesive properties of the obtained copper pattern circuit were excellent.

EXAMPLE 7

On KAPTON (Trade Name of a polyimide film manufactured and sold by Du Pont, U.S.A.) having a thickness of 200μ, AER-666 (Trade Name of epoxy resin produced by Asahi Kasei Kogyo K.K., Japan and having a melting point of about 100° C.) was coated in a thickness of 10μ by using a solution thereof in 1,900 parts by weight of methyl ethyl ketone (5% solution). Tellurium was sputtered on the coat in a thickness of 1,000 Å. The obtained board material was subjected through a circuit pattern mask to flashlight of 1 millisecond pulse width and quantity of 0.8 joule/cm$^2$ emitted from a xenon flashlamp to form a circuit pattern. The board material was then subjected to a copper plating by using CP-70 (Trade name of an electroless copper plating solution prepared by Shipley, U.S.A.). Copper was selectively deposited on the unexposed portions to provide a copper circuit of high electrical contrast. The adhesive properties of the obtained copper pattern circuit were excellent.

What is claimed is:

1. A printed circuit board comprising:
    a base made of an insulating material;
    a layer coated on the base and made of a polymer having a melting point or a softening point of 50 to 300° C. which polymer is selected from the group consisting of polyurethane, polyvinylidene chloride, polyvinyl acetate, polyvinyl butyral, a copolymer of vinylidene chloride and vinyl acetate or acrylonitrile, a copolymer of vinyl chloride and vinyl acetate, a polycarbonate, a polyamide, a copolymer of styrene and acrylonitrile, a copolymer of acrylonitrile, butadiene and styrene, an epoxy resin, and blends thereof;
    a layer covered on the layer of polymer and made of a dispersion imaging material containing elements selected from the group consisting of iron, cobalt, nickel, copper, silver, gold, bismuth, antimony, tin, aluminum, cadmium, zinc, lead, selenium, indium and tellurium;
    said layer of dispersion imaging material having dispersed portions and undispersed portions; and
    a pattern circuit of a conductive metal deposited only on said undispersed portions of the dispersion imaging material.

2. A printed circuit board as set forth in claim 1, wherein the melting point or the softening point of the polymer layer is lower than the melting point of the dispersion imaging material layer covered thereon.

3. A printed circuit board as set forth in claim 1 wherein said layer of dispersion imaging material has a thickness of 50 to 2,500 Å.

4. A printed circuit board as set forth in claim 1 wherein said layer of dispersion imaging material is of a member selected from the group consisting of iron, cobalt and nickel.

5. A printed circuit board as set forth in claim 4, wherein said layer of dispersion imaging material is of nickel.

6. A printed circuit board as set forth in claim 1 wherein said polymer layer has a thickness of 0.5 to 100μ.

7. A printed circuit board as set forth in claim 1, wherein said polymer layer is made of an epoxy resin.

8. A printed circuit board as set forth in claim 1, wherein said polymer layer is of a blend of an epoxy resin and a polyurethane.

9. A printed circuit board as set forth in claim 1, wherein said polymer layer is of a blend of an epoxy resin and a polyvinylbutyral.

10. A printed circuit board as set forth in claim 1, wherein said base is of a laminate made of a resin selected from the group consisting of an epoxy resin, a phenolic resin and a polyester resin.

11. A printed circuit board as set forth in claim 1, wherein said base is of a film made of a resin selected from the group consisting of a polyester and a polyimide.

12. A printed circuit board as set forth in claim 1, wherein said conductive metal deposited on the undispersed portions is copper.

13. A printed circuit board as set forth in claim 1, wherein said conductive metal deposited on the undispersed portions is nickel.

* * * * *